(12) United States Patent
Chong et al.

(10) Patent No.: US 10,529,894 B2
(45) Date of Patent: Jan. 7, 2020

(54) CONTACT ETCHING AND METALLIZATION FOR IMPROVED LED DEVICE PERFORMANCE AND RELIABILITY

(71) Applicants: David Chong, Singapore (SG); Yeow-Meng Teo, Johor Bahru (MY)

(72) Inventors: David Chong, Singapore (SG); Yeow-Meng Teo, Johor Bahru (MY)

(73) Assignee: Lumileds Holding B.V., Schiphol (NL)

( * ) Notice: Subject to any disclaimer, the term of this patent is extended or adjusted under 35 U.S.C. 154(b) by 0 days.

(21) Appl. No.: 15/777,255

(22) PCT Filed: Nov. 14, 2016

(86) PCT No.: PCT/US2016/061816
§ 371 (c)(1),
(2) Date: May 18, 2018

(87) PCT Pub. No.: WO2017/087315
PCT Pub. Date: May 26, 2017

(65) Prior Publication Data
US 2018/0337308 A1    Nov. 22, 2018

Related U.S. Application Data

(60) Provisional application No. 62/258,318, filed on Nov. 20, 2015.

(30) Foreign Application Priority Data

Mar. 10, 2016   (EP) ...................... 16159678

(51) Int. Cl.
*H01L 33/38* (2010.01)
*H01L 33/44* (2010.01)
(Continued)

(52) U.S. Cl.
CPC .......... *H01L 33/382* (2013.01); *H01L 33/405* (2013.01); *H01L 33/44* (2013.01);
(Continued)

(58) Field of Classification Search
CPC ....... H01L 33/38; H01L 33/405; H01L 33/40; H01L 33/46; H01L 33/44
See application file for complete search history.

(56) References Cited

U.S. PATENT DOCUMENTS

2004/0061123 A1   4/2004 Shelton et al.
2005/0274956 A1   12/2005 Bhat
(Continued)

FOREIGN PATENT DOCUMENTS

DE   102007062046   6/2009
EP   1734623        12/2006

*Primary Examiner* — Thanhha S Pham
(74) *Attorney, Agent, or Firm* — Volpe and Koenig, PC

(57) ABSTRACT

A light emitting device includes a vertical via through the P-type semiconductor layer and the active layer. Using a vertical via reduces quantum well damage, allows shortening of P-N spacing, and allows increased reflective area. A dielectric structure is formed in the via to provide a sloped wall that extends to an upper surface of the device. Another dielectric layer covers the upper surface and the sloped wall, and provides select contacts to the semiconductor layers. A metal layer is subsequently applied. Because the dielectric layers provide a continuous slope from the surface of the device, the metal layer does not include a vertical drop. Because the active layer does not extend into the via, the contact to the N-type semiconductor layer may be situated closer to the wall of the via, increasing the area available for a reflective layer.

10 Claims, 4 Drawing Sheets

(51) Int. Cl.
 H01L 33/46 (2010.01)
 H01L 33/40 (2010.01)
 H01L 33/06 (2010.01)

(52) U.S. Cl.
 CPC .............. *H01L 33/46* (2013.01); *H01L 33/06* (2013.01); *H01L 2933/0016* (2013.01); *H01L 2933/0025* (2013.01)

(56) References Cited

U.S. PATENT DOCUMENTS

| | | | |
|---|---|---|---|
| 2007/0096130 A1 | 5/2007 | Schiaffino et al. | |
| 2011/0076824 A1 | 3/2011 | Choi et al. | |
| 2015/0021738 A1 | 1/2015 | Camillo-Castillo et al. | |
| 2018/0309029 A1* | 10/2018 | Kim | H01L 33/382 |

* cited by examiner

CONTACT ETCHING AND METALLIZATION FOR IMPROVED LED DEVICE PERFORMANCE AND RELIABILITY

CROSS-REFERENCE TO RELATED APPLICATIONS

The present application claims priority to U.S. Provisional Patent Application No. 62/258,318, filed Nov. 20, 2015 and European Patent Application No. 16159678.8 filed Mar. 10, 2016. U.S. Provisional Patent Application No. 62/258,318 and European Patent Application No. 16159678.8 are incorporated herein.

FIELD OF THE INVENTION

This invention relates to the field of semiconductor light emitting devices, and in particular to a fabrication method that improves device performance and reliability.

BACKGROUND OF THE INVENTION

The ever increasing use of semiconductor light emitting devices (LEDs) has created a highly competitive market, wherein performance and reliability can significantly affect the success of a product.

FIGS. 1A-1D illustrate an example process for fabricating a semiconductor light emitting device. These figures illustrate a profile view of the device as it is being formed. One of skill in the art will recognize that a top view of the light emitting device could show a circular via 180, particularly if an etching process is used to form the via, or a trench/elongated via or an edge contact. For the purposes of this disclosure, and as detailed further below, a via is any opening that enables an electric conductor to connect an upper layer to a lower layer, through one or more intermediate layers.

In FIG. 1A, an N-type semiconductor layer 120 is grown upon a substrate 110, followed by an 'active' layer 130 and a P-type semiconductor layer 140. The active layer 130 emits light when a potential is applied between the N-type 120 and P-type 140 semiconductor layers.

In this example, the light that is emitted from the active layer is intended to exit the light emitting device through the N-type semiconductor layer 120; the substrate 110 may be transparent at least to wavelength the light emitted by the active layer, and/or it may be removed after the light emitting device is formed.

To increase the amount of light that exits the device, a reflective layer 150 may be formed above the P-type semiconductor layer 140. This reflective layer 150 redirects light toward the N-type semiconductor layer 120, reducing the likelihood of optical loss due to absorption within the light emitting device. In this example, the reflective layer 150 is patterned with an opening 155 that facilitates subsequent steps in the fabrication process, as detailed further below. Also in this example, the reflective layer forms the contact to the P-type semiconductor. The reflective layer 150 may include a silver (Ag) layer that is encapsulated in a barrier layer that minimizes the surface migration of the silver. The barrier layer may be, for example, a titanium tungsten (TiW), titanium tungsten nitride combination (TiWN), or titanium nitride (TiN). This reflective layer 150 is conductive, which facilitates current distribution across the P-type semiconductor layer 140.

In FIG. 1B, the P-type semiconductor layer 140 and active layer 130 are etched to create a via 180 that facilitates contact to the N-type semiconductor layer 120. Plasma-Ion isotropic etching 190 is commonly used to produce sloped via walls 185 within the via 180; these sloped walls 185 facilitate the application of a metal layer to contact the N-type semiconductor layer 120. The size of the via 180 at the opening 155 (FIG. 1A) at the reflective layer 150 is determined based on the width 125 of exposure of the N-type semiconductor layer 120 that is required to enable sufficient contact with the N-type layer 120 and sufficient separation from the active layer 130, as detailed further below.

Although the via 180 may have a single continuous wall around its perimeter, the plural term "via walls" is used herein to refer to the wall segments that appear in the cross-section view. As illustrated in FIG. 1B, the reflective layer 150 extends to the edge of the via 180, to maximize the reflective surface area.

In FIG. 1C, a dielectric layer 160 is formed to insulate the exposed N-type semiconductor layer 120 and the reflective layer 150 on the P-type semiconductor layer 140. This dielectric layer 160 is subsequently etched to enable select contact 165N, 165P to layers 120, 150 respectively, as illustrated in FIG. 1D. Grey shading is used to indicate insulation from the conductive layers, for ease of understanding.

After etching the dielectric layer 160 to enable contact 165N, 165P to the N-type semiconductor layer 120, and the conductive reflective layer 150 that contacts the P-type semiconductor layer 140, a metal layer 170 is applied. The metal layer 170 flows into the etched regions 165N and 165P to provide contact with the layers 120, 150. This metal layer 170 is patterned to create isolated metal segments 170N and 170P for connection to the N-type 120 and P-type 140 semiconductor layers, respectively.

The etching of the regions 165N and 165P is controlled to assure at least a minimum width 168N and 168P for adequate contact to the layers 120, 150. Additionally, a minimum separation 178 must be maintained between the contact of the N-type semiconductor layer 120 at the region 165N and the active region 130. The size 155 of the opening in the reflective layer 150 for forming the via 180 must also take into consideration the extent 188 of the active region 130 remaining after etching due to the sloped walls 185. Of particular note, the width 168N, the separation 178, and the extent 188 of the active region 130 remaining after etching are preferably as small as feasible, so that the size of the opening 155 may be as small as feasible, thereby maximizing the potential surface area for the reflective layer 150.

As can be seen, the minimum width/diameter of the via 180 at the opening 155 of the reflective layer 150 is equal to the width 168N of the contact plus twice the separation 178 plus twice the extent 188 of the active region 130 remaining after etching due to the slope wall 185.

The desire to maximize the coverage of the reflective layer 150, however, may introduce undesirable secondary effects. The extension of the reflective layer 150 to the edge of the via 180, for example, introduces an edge 161 in the dielectric layer 160 that extends vertically, which introduces a vertical drop 171 in the profile of the metal layer 170N. Gravity and other factors will cause a thinning of the metal layer 170N at the vertical drop 171 during fabrication, which may introduce gaps or cracks in the metal layer 170N, which may result in a premature failure of the device. A thicker coating of metal 170 may be applied, but this increases the cost of the device. The reflective coating 150 may be offset from the edge of the via 180, providing a more gradual descent, but this reduces the reflective surface area, resulting in more optical loss due to absorption.

SUMMARY OF THE INVENTION

It would be advantageous to provide a light emitting device with improved reliability. It would also be advantageous to provide a light emitting device with improved performance.

To better address one or more of these features, in an embodiment of this invention, a light emitting device includes a vertical via through the P-type semiconductor layer and the active layer. A dielectric structure may be formed in the via to provide a sloped wall that extends to an upper surface of the device. Another dielectric layer covers the upper surface and the sloped wall, and provides select contacts to the semiconductor layers. A metal layer is subsequently applied. Because the dielectric layers provide a continuous slope from the surface of the device, the metal layer does not include a vertical drop. Because the active layer does not extend into the via, the contact to the N-type semiconductor layer may be situated closer to the wall of the via, increasing the area available for a reflective layer. Additionally, because the walls of the via are vertical, less damage is caused to the active layer during plasma-ion etching.

In an embodiment, the light emitting device comprises an active layer that is sandwiched between a first-type semiconductor layer and a second-type semiconductor layer; a via that extends to the first-type semiconductor layer, through the second-type semiconductor layer and the active layer, the via having walls that are substantially orthogonal to a light emitting surface of the active layer. The device may include a reflective layer that extends over the second-type semiconductor layer to the via; a dielectric structure that provides, within the via, a substantially continuous slope from the reflective layer; and a metal layer that is situated upon the dielectric structure and contacts the first-type semiconductor layer.

The dielectric structure may include a first dielectric structure that provides the slope within the via, and a second dielectric structure that extends over the reflective layer and onto the slope within the via. The dielectric structure may include $SiN_x$, $SiO_x$, Si-oxy-nitride, or a combination thereof.

The reflective layer may include silver, and a barrier layer may be provided to control migration of the silver. The barrier layer may include TiW, TiWN, TiN, or a combination thereof. The metal layer may include Al, Ti, Au, Ni, or a combination thereof.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

Figure 1A:
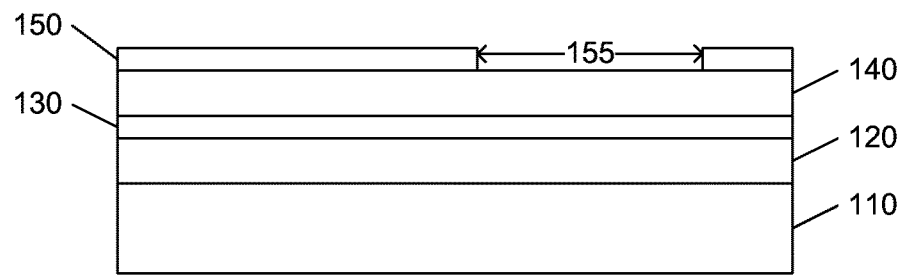
FIGS. 1A-1D illustrate an example process for fabricating a light emitting device.
Figure 1B:
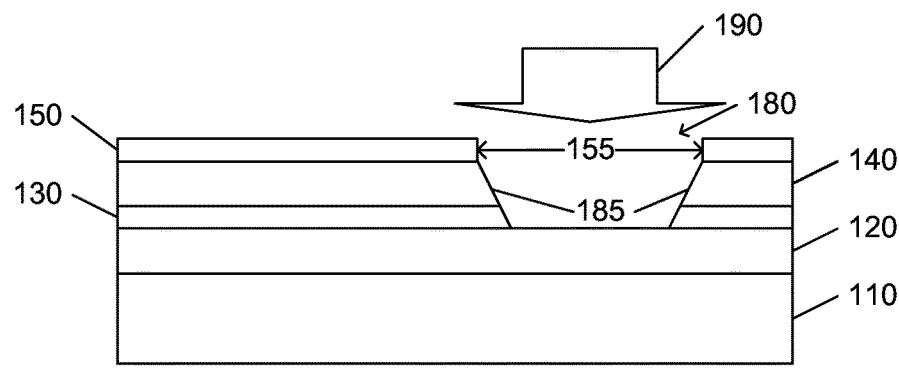

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

With respect to the prior art light emitting device of FIGS. 1A-1D, the inventors have determined that the surface of the active layer 130 on the sloped wall 185 of the via 180 (FIG. 1B) is damaged by the reactive ion etching (RIE) used to create the via. This damage increases the current leakage through surface depletion on the inclined surface. The inventors have also determined that contamination particles may "collect" on the inclined surface, which may increase the likelihood of defective devices. However, as detailed above, an inclined surface is required to enable reliable metallization in the via 180.

FIGS. 2A-2F illustrate an example process for fabricating a light emitting device with vertical vias, each of the figures illustrating a profile view. These figures use the reference numerals used in FIGS. 1A-1D for the N-type layer 120, the active layer 130, the P-type layer 140, and the reflective layer 150. The substrate 110 of FIGS. 1A-1D is omitted in FIGS. 2A-2F for ease of illustration and understanding.

As in FIGS. 1A-1D, one of skill in the art will recognize that a top view of the light emitting device of FIGS. 2A-2F would likely show a circular via 280, particularly if an etching process is used to form the via. Accordingly, the singular term "via wall" is used herein, even though the profile figures may appear to illustrate multiple walls. One of skill in the art, however, will recognize that the principles of this invention are applicable regardless of the shape of the perimeter of the via 280.

Figure 2A:
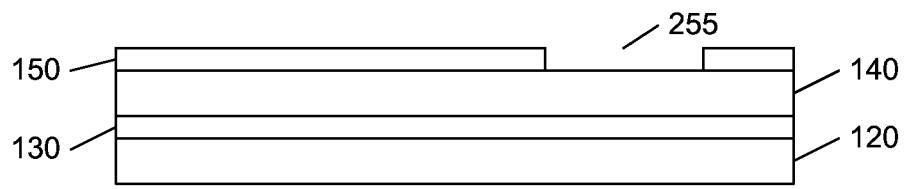
FIGS. 2A-2F illustrate an example process for fabricating a light emitting device with vertical vias.

FIG. 2A is similar to FIG. 1A, with the exception that the opening 255 in the reflective layer 150 is narrower than the opening 155 of FIG. 1A. This reduction in the size of the opening 255 increases the surface area of the reflective layer 150. This reduction is realized by forming a vertical via 280 to the N-type layer 120 through the P-type layer 140 and active layer 130, as detailed further below.

Figure 1D:
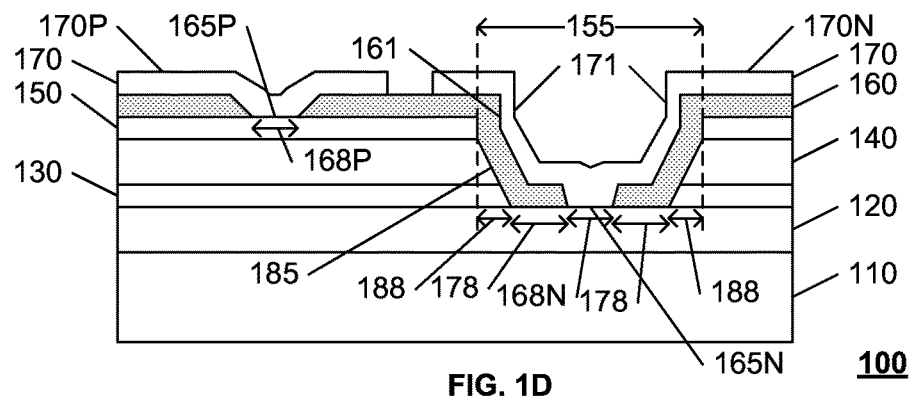
Figure 2B:
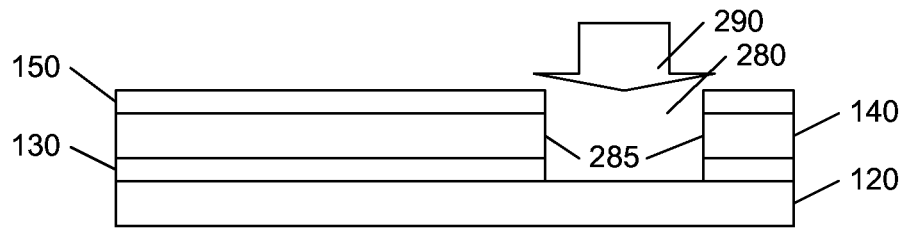

FIG. 2B illustrates the formation the vertical via 280. Anisotropic plasma-ion etching may be used to create the vertical via 280, and may use chlorine as the main etchant. Because the walls 285 of the via 280 are vertical, the active layer 130 does not extend into the via 280, and which substantially reduces the plasma-induced damage to the active area 130 caused by the direct RIE powered ion bombardment of the prior art of FIG. 1B. Additionally, because less damage is done to the active layer 130, less current leakage current will be produced, allowing the separation distance (178 in FIG. 1D) between the active region and the contact to the N-layer 120 to be decreased. The vertical wall 285 also does not provide a horizontal surface of the active area 130 for contamination to collect upon. In one alternative a portion of N-layer 120 may be etched.

Figure 2C:
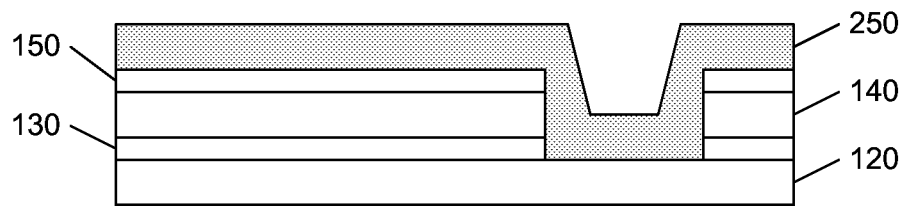
Figure 2D:
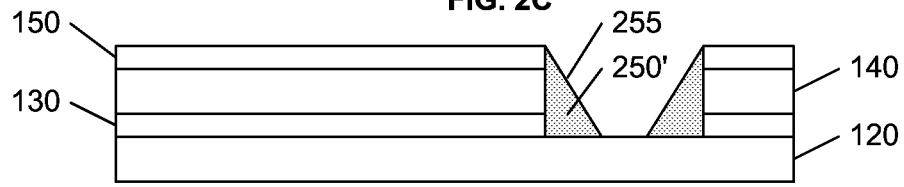

In FIG. 2C, a first dielectric layer 250 is applied, in FIG. 2D, the dielectric 250 is shaped to form dielectric structure 250', which provides a slope 255 that extends from the upper surface of the reflective layer 150 to the N-type semiconductor layer 120.

One of skill in the art will recognize that the opening 255 in the reflector layer 150 may serve as a mask for forming the vertical via 280, or it may be created in the same process that creates the vertical via 280.

Figure 1C:
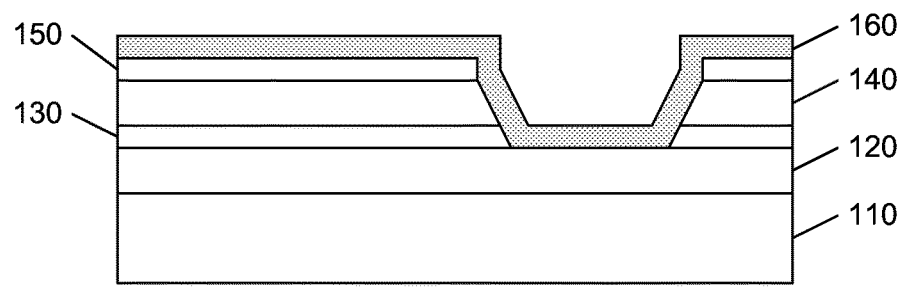
Figure 2E:
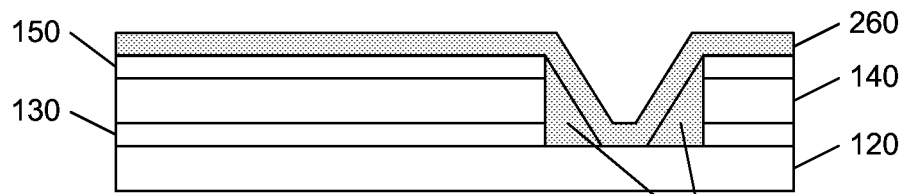

In FIG. 2E, a second dielectric layer 260 is applied, serving the same function as the dielectric layer 160 in FIG. 1C. This layer 260 is subsequently etched to provide openings 265N and 265P that enable contact to the N-type layer 120 and P-type layer, respectively, as illustrated in FIG. 2F.

The dielectric layers 250, 260 may be any insulating material, including $SiN_x$, $SiO_x$, Si-oxy nitride, and combinations thereof. One of skill in the art will recognize that the dielectric layers 250, 260 may be created as a single dielectric structure, but creating the shape illustrated in FIG. 2F in a single process may require a more complex process.

Figure 2F:
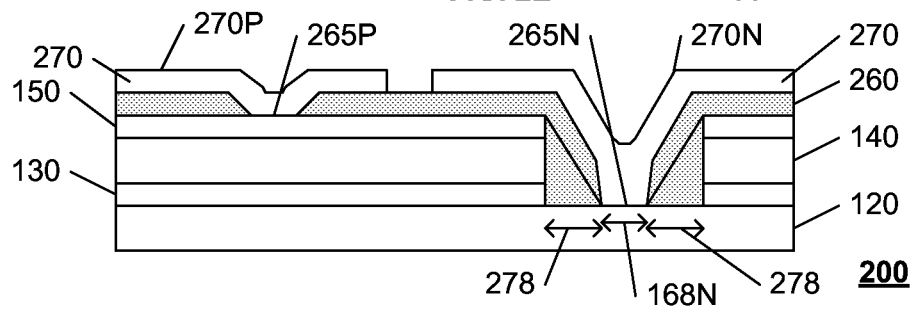

In FIG. 2F, a metal layer 270 is applied and patterned to create isolated segments 270N and 270P. The metal layer 270 may include Al, Ti, Au, Ni, or a combination of metals to form ohmic and electrical contact to the N-type 120 and P-type 140 layers, and may be applied using an evaporation process, or other metallization processes common in the art. A photoresist may be used before the metal layer 270 is applied, to create the isolation between the metal segments 270N and 270P, then lifted off after the metal segments 270N and 270P are formed.

In addition to producing a reduction in RIE-induced damage and contamination collection at the active layer 130, the use of a via 280 with substantially vertical walls 285 also allows for the use of a smaller via 280, compared to the via 180 of device 100 in FIG. 1D. This reduction in via size enables a larger reflective surface area.

As noted above, the minimum width of the via 180 at the opening 155 of the reflective layer 150 of device 100 is equal to the width 168N of the contact plus twice the separation 178, plus twice the extent 188 of the active region 130 remaining after etching due to the slope wall 185. By using a vertical via, the extent of the active region 130 remaining after etching is zero, and the separation 278 between the active layer 130 and the contact to the N-type layer 120 of device 200 may be smaller than the separation 178 of device 100 due to less current leakage from the active layer 130.

Figure 3:
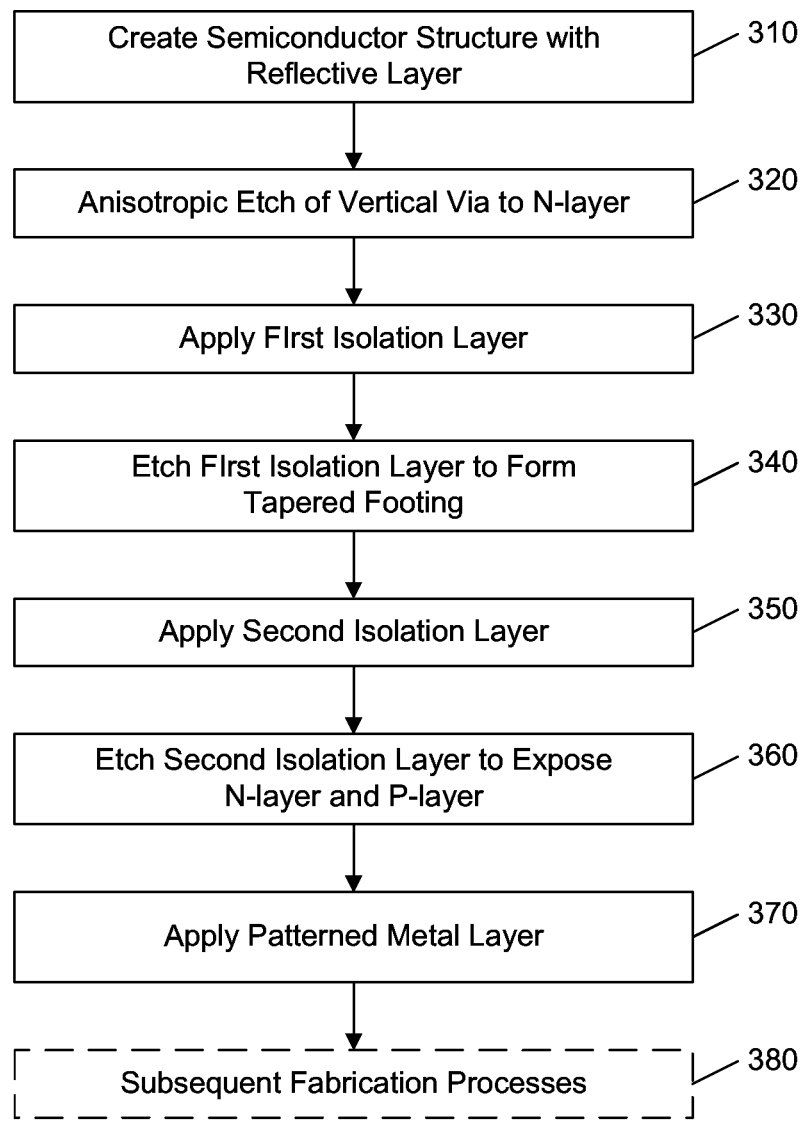
FIG. 3 illustrates an example flow diagram of a process for fabricating a light emitting device with vertical vias.

FIG. 3 illustrates an example flow diagram of a process for fabricating a light emitting device with one or more vertical vias. For ease of understanding, the process is described herein with regard to a single light emitting device with a single vertical via to an N-type layer, although one of skill in the art will recognize that this process will generally be applied at the wafer level, wherein hundreds of light emitting devices are processed simultaneously.

At 310, the semiconductor structure with reflective layer is provided. This structure may include an N-type semiconductor layer and a P-type semiconductor layer that sandwich an active layer comprising one or more quantum wells for emitting light. The P-type, N-type, and active layers may include GaN, InP or GaP or a combination of doped 3-5 Epi substrate, including Al, In, Ga, As, P, and others. The dopants may include Si, Mg, and/or C, or a combination thereof. The reflective layer may include TiW, TiWN, TiN, or a combination of these metals, or others.

At 320 the semiconductor structure is etched to provide a vertical via through the P-type layer and the active layer. The reflector layer may have patterned openings to facilitate the creation of this via to the N-type layer, or the reflector layer may also be etched in this process. A dry etch process using chlorine as the main etchant, which etches anisotropically through the P-type layer and the active layer and stops at the N-layer, or slightly into the N-type layer. The resultant profile is a vertical via, and plasma damage to the active layer is greatly reduced due to reduced direct RIE powered ion bombardment of the remaining active layer. This reduction in damage also allows a shorter distance between the P-type layer and contact to the N-type layer because current leakage through surface depletion at the P-N junction is reduced. Accordingly, assuming that the size of N-contact is the same as the size of the N-contact of the prior art (178 of FIG. 1), the reflective layer on the P-type layer can be larger, to reflect more light and to gain more light output.

At 330, a first isolation layer is formed over the reflective layer and into the vertical via. The isolation layer may be $SiN_x$, $SiO_x$, Si-oxy-nitride, or a combination thereof, or any other commonly used dielectric materials. A plasma-enhanced chemical vapor deposition (PECVD) process may be used to apply this layer. The thickness of the first isolation layer over the reflective layer may be slight. The thickness of the first isolation layer within the via should be sufficient to enable the formation of the inclined surface by an etching process, at 340.

At 340, the first isolation layer is etched to form an inclined surface that extends from the N-type layer to the upper surface of the reflective layer. A dry etch process using fluorocarbon gases as the main etchant may be used to form this inclined surface. Sufficient area of the N-type layer should be exposed in this step to assure adequate contact to the N-type layer, and the extent of the first isolation area onto the N-type layer should be sufficient to assure the minimum specified distance between the P-type layer and the contact to the N-type layer.

At 350, a second isolation layer is formed over the reflective layer and into the vertical via. The second isolation layer may also be $SiN_x$, $SiO_x$, Si-oxy-nitride, or a combination thereof, or any other commonly used dielectric materials. A plasma-enhanced chemical vapor deposition (PECVD) process may also be used to apply this layer. This process provides a continuous, smooth, and tapered sidewall profile. The thickness of the second isolation layer over the reflective layer and within the via should be sufficient to maintain electrical isolation at a specified voltage.

As noted above, steps 330-350 may be combined by the application of a single isolation layer that forms an inclined surface from the upper surface of the reflector level toward the N-type layer. However, such a process may be very complex and difficult to control.

At 360, the second isolation layer is etched to provide access to the N-type layer and the reflective layer, which is in electric contact with the P-type layer. The size of the access opening in the N-type and reflective layers should be sufficient to assure adequate contact to these layers. The extent of the second isolation material onto the N-type layer should be sufficient to assure the minimum specified distance between the P-type layer and the contact to the N-type layer.

At 370, a metal layer is applied above the second isolation layer and into the openings to the N-type layer and reflective layer. An evaporation process may be used to apply the metal layer, using such metals as Al, Ti, Au, Ni, or a combination thereof, as well as other metals, and a photoresist process may be used to pattern the metal layer to isolate the contacts to the N-type layer and the reflective layer, which is in electrical contact with the P-type layer.

At 380, the remaining processing steps are performed to create a packaged light emitting device.

As noted above, the term via, as used herein, includes any opening that enables a conductor to couple an upper layer to a lower layer, through one or more intermediate layers, and is not limited to any particular shape.

Figure 4A:
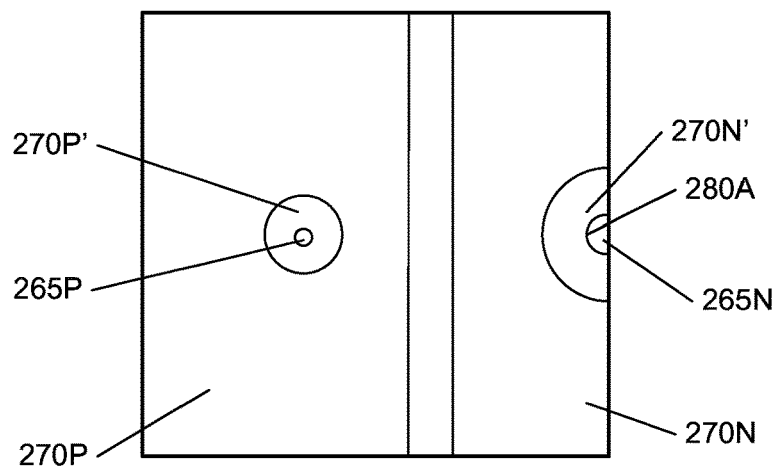
FIGS. 4A-4C illustrate example light emitting devices with alternative via designs.
Figure 4B:
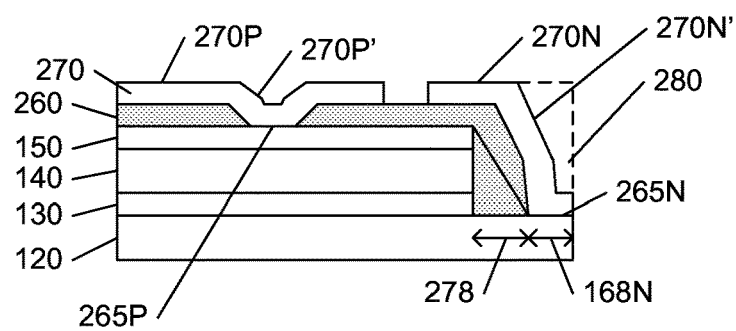
Figure 4C:
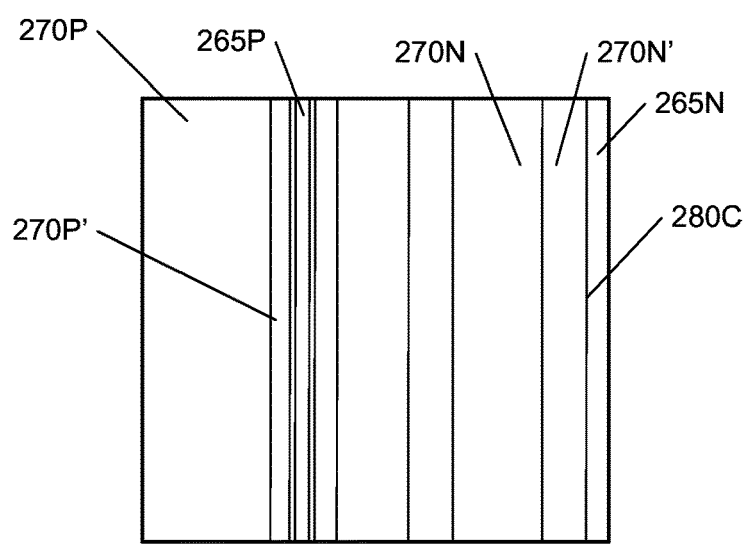

FIGS. 4A and 4C illustrate two example alternative embodiments with a similar cross-section view 4B, wherein the via 280 is not a circle per se. In these FIGs, the metal layers 270P and 270N extends across the entire device, with the sloped portion of the metal layers 270P, 270N being identified as 270P' and 270N' and the contact area being identified as 265P and 265N.

In FIG. 4A, the via 280A is semicircular. This via 280A may be formed by creating circular or elongated vias in a wafer, then slicing along a 'street' that bisects these vias. In an example embodiment, the individual die on the wafer may be 'back to back' (one die being the mirror image of the other in one dimension), and the circular or elongated via may extend across these back-to-back dies. In this manner, two dies with semicircular vias 280A may be formed when the dies are sliced/diced/singulated. As is common in the art, an etching or other process may be used to minimize contamination and/or damage caused during the singulation process.

In FIG. 4C, the via 280C extends along the entire extent of the die. This via 280C may be made by etching a 'trench' that extends across an entire column of dies on a wafer. As in the example of FIG. 4A, if the individual dies are fabricated in a back-to-back pattern, the trench may extend across each pair of back-to-back dies, such that this trench is bisected when the wafer is sliced to singulate each die.

In the example of FIG. 4C, the trenches may be formed by other than an etching process. Laser or mechanical cuts that extend down to the N-type layer 120 may be used to create the vertical walls of the via before the first dielectric is applied to create the sloped walls within the via 120 may be used to create the vertical walls of the via before the first dielectric is applied to create the sloped walls within the via. In such a laser or mechanical trenching, a restorative process may be used after creating the trenches to ensure the surfaces are free of damage and/or contamination before applying the first dielectric.

One of skill in the art will recognize that other patterns may be used to create the vias, and different processes may be used to create the individual features of the light emitting devices.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the reflective layer 150 may comprise various combinations of Ag, $SiO_x$, $NbO_x$, ZnO, $TiO_x$ and indium tin oxide (ITO), wherein the resultant combination exhibits a light-reflective property and also provide an appropriate contact to the P-type semiconductor. The metal layer 270 may comprise other metal combinations that include TiW, TiWN and Cu. The patterning processes may require various combinations of photolithography, plasma etching, chemical etching and/or resist liftoff.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting device comprising:
   a semiconductor structure comprising an active layer between a first-type semiconductor layer and a second-type semiconductor layer;
   a reflective layer over the semiconductor structure;
   a via in the reflective layer, the second-type semiconductor layer and the active layer, the via having walls within the semiconductor structure that are substantially orthogonal to a surface of the active layer;
   a dielectric structure comprising, within the via, a first surface facing a center of the via that extends from a top surface of the reflective layer to the first-type semiconductor layer to form an acute angle with the first-type semiconductor layer, a second surface facing the walls of the via that is substantially orthogonal to the surface of the active layer and a third surface facing the first-type semiconductor layer that is parallel to the surface of the active layer; and
   a metal layer on the dielectric structure and contacting the first-type semiconductor layer.

2. The light emitting device of claim 1, wherein the dielectric structure includes a first dielectric structure that provides a slope within the via formed by the acute angle, and a second dielectric structure that extends over the reflective layer and onto the slope within the via.

3. The light emitting device of claim 1, wherein the metal layer includes one or more of: Al, Ti, Au, and Ni.

4. The light emitting device of claim 1, wherein the reflective layer includes silver.

5. The light emitting device of claim 4, including a barrier layer that controls migration of the silver.

6. The light emitting device of claim 5, wherein the barrier layer includes one or more of: TiW, TiWN and TiN.

7. The light emitting device of claim 1, wherein the dielectric structure includes one or more of: $SiN_x$, $SiO_x$, and Si-oxy-nitride.

8. The light emitting device of claim 1, wherein the reflective layer includes a combination of two or more of: Ag, $SiO_x$, $NbO_x$, ZnO, $TiO_x$ and indium tin oxide (ITO).

9. The light emitting device of claim 1, wherein the metal layer is in electrical contact with the second-type semiconductor layer via the reflective layer.

10. The light emitting device of claim 1, wherein the via having walls within the semiconductor structure comprises walls created by at least one surface of the semiconductor structure.

* * * * *